United States Patent
Rezvani (12)

(10) Patent No.: US 6,192,445 B1
(45) Date of Patent: *Feb. 20, 2001

(54) SYSTEM AND METHOD FOR PROGRAMMING EPROM CELLS USING SHORTER DURATION PULSE(S) IN REPEATING THE PROGRAMMING PROCESS OF A PARTICULAR CELL

(75) Inventor: Saiid Rezvani, Los Gatos, CA (US)

(73) Assignee: Altera Corporation, San Jose, CA (US)

( * ) Notice: Under 35 U.S.C. 154(b), the term of this patent shall be extended for 0 days.

This patent is subject to a terminal disclaimer.

(21) Appl. No.: 09/121,016

(22) Filed: Jul. 22, 1998

Related U.S. Application Data

(63) Continuation of application No. 08/791,588, filed on Jan. 31, 1997, now Pat. No. 5,873,113
(60) Provisional application No. 60/025,312, filed on Sep. 24, 1996.

(51) Int. Cl.⁷ ..................................................... G06F 12/02
(52) U.S. Cl. ................ 711/103; 365/185.19; 365/185.22
(58) Field of Search ....................... 711/103; 365/185.19, 365/185.2, 185.22, 185.33

(56) References Cited

U.S. PATENT DOCUMENTS

| 5,200,920 | 4/1993 | Norman et al. ........................ 365/185 |
| 5,357,476 | 10/1994 | Kuo et al. ............................. 365/218 |
| 5,523,972 | * 6/1996 | Rashid et al. .................... 365/185.22 |
| 5,764,568 | * 6/1998 | Chevallier ....................... 365/185.03 |
| 5,801,991 | * 9/1998 | Keeney et al. .................. 365/185.23 |
| 5,822,781 | * 10/1998 | Wells et al. .......................... 711/171 |
| 5,873,113 | * 2/1999 | Rezvani ................................ 711/103 |

* cited by examiner

Primary Examiner—Hiep T. Nguyen
(74) Attorney, Agent, or Firm—Limbach & Limbach L.L.P.

(57) ABSTRACT

A programming system and method for programming a programmable memory device having multiple individually programmable memory cells, such as an electrically programmable read only memory (EPROM), includes the use of an address and programming pulse signal source and a programming and test controller for establishing, based upon the programming of a small number of on-chip sample memory cells, a presumptively sufficient initial programming pulse duration for programming the remaining memory cells. In the event it is found during actual programming that such an initial programming pulse duration is insufficient for any particular memory cell, additional programming pulses, each of which is significantly shorter in duration than the initial programming pulse, are applied to such memory cell as needed until the programming of such memory cell is completed.

32 Claims, 2 Drawing Sheets

SYSTEM AND METHOD FOR PROGRAMMING EPROM CELLS USING SHORTER DURATION PULSE(S) IN REPEATING THE PROGRAMMING PROCESS OF A PARTICULAR CELL

RELATED APPLICATIONS

This application claims the benefit of U.S. Provisional Application No. 60/025,312, filed Sep. 24, 1996, and entitled "Two-Pulse Method of Programming EPROM Cells." Which is a continuation of Ser. No. 08/791,588 filed Jan. 31, 1997 U.S. Pat. No. 5,873,113.

BACKGROUND OF THE INVENTION

1. Field of the Invention

The present invention relates to systems and methods for programming the memory cells of programmable memory devices, and in particular, to systems and methods for programming EPROM cells which require that multiple programming pulses be applied to selected memory cells.

2. Description of the Related Art

Referring to FIG. 1, as is well known in the art, the transistor forming a memory cell for an electrically programmable read only memory device (EPROM) has a floating polysilicon gate which is located between an access gate and the substrate and is electrically isolated from the substrate by a gate oxide and from the access gate by a dielectric inter-poly oxide.

During programming, a high programming voltage VPP is applied to the access gate while a lower voltage VD is applied to the drain and the source is grounded. As electrons flow from the source to the drain, they pick up kinetic energy and their path is altered by an electric field which is between the access gate and substrate and is generated by the potential difference between the programming voltage VPP on the access gate and the biasing voltage VD on the drain. Those electrons which achieve sufficient kinetic energy accelerate vertically toward the floating gate, passing through the gate oxide, and are trapped on the floating gate electrode, thereby creating a net negative voltage on the floating gate which opposes any electric field created by a positive voltage on the access gate. This results in a substantial increase in the threshold voltage required to transform the EPROM memory cell from a nonconductive state to a conductive state.

With conventional EPROM programming techniques, a small number of sample EPROM cells are used to sample the programmability of the remaining cells. Each sample cell is programmed by applying a sample programming pulse with a known relatively short pulse width and is immediately verified. If needed, more pulses of the same short width are applied followed by further verification until such cell is fully programmed. The maximum number of such short pulses that any of the sample cells took to reach the desired programming state is then used to establish the width, i.e., duration, of a longer programming pulse that will then be applied to the remaining cells. Typically, the duration of this longer pulse is simply set equal to the combined durations of the short pulses that were used to program the slowest sample cell. Thereafter, all remaining cells are then programmed by applying one or more of such longer pulses, as required, to each cell.

Such conventional technique, however, generally results in a significant amount of wasted time in programming and verifying an EPROM device. For example, for each cell which requires multiple programming pulses, the duration of each one of such programming pulses is that of the longest programming pulse duration found necessary to program the slowest sample memory cell. However, if the cell currently being programmed is not as slow as the slowest sample cell, but requires multiple programming pulses nonetheless, a proportionately significant amount of time can be wasted by applying extra programming pulses which are longer than necessary.

Accordingly, it would be desirable to have a programming technique in which advantage can be taken of the fact that it is statistically unlikely that most memory cells which are slower to program than the slowest sample memory cell will have programming times which are integer multiples of the programming time of the slowest sample cell.

SUMMARY OF THE INVENTION

A programming system and method in accordance with the present invention provides for the programming of programmable memory devices in significantly less time than conventional techniques. Each memory cell is programmed by using an initial programming pulse having a duration which is based upon programming tests conducted upon sample memory cells and then supplementing such initial programming with auxiliary programming pulses, as needed, each of which has a duration which is shorter than the initial programming pulse duration.

In accordance with one embodiment of the present invention, a programming system for programming a programmable memory device having multiple individually programmable memory cells includes a programming signal source and a programming controller. The programming signal source is configured to couple to a programmable memory device which includes multiple programmable sample memory cells and multiple programmable main array memory cells and provide thereto multiple programming signals by performing the steps of:

(a) receiving a programming mode control signal and in accordance therewith applying a programming mode signal to the programmable memory device in accordance with which the programmable memory device becomes configured for programming;

(b) receiving a plurality of sample programming control signals and in accordance therewith applying a plurality of sample programming signals to the programmable memory device;

(c) receiving a sample programming pulse control signal and in accordance therewith applying a sample programming pulse having a sample programming pulse duration to one of the plurality of programmable sample memory cells;

(d) receiving a programming verification control signal and in accordance therewith applying a programming verification signal to the programmable memory device;

(e) receiving a plurality of main array programming control signals and in accordance therewith applying a plurality of main array programming signals to the programmable memory device;

(f) receiving an initial main array programming pulse control signal and in accordance therewith applying an initial main array programming pulse having an initial main array programming pulse duration to one of the plurality of programmable main array memory cells;

(g) receiving an auxiliary main array programming pulse control signal and in accordance therewith applying an auxiliary main array programming pulse having an auxiliary main array programming pulse duration to the one of the plurality of programmable main array memory cells.

The programming controller is coupled to the programming signal source and is configured to couple to the programmable memory device and perform the steps of:

(h) providing the programming mode control signal;

(i) providing the plurality of sample programming control signals;

(j) providing the sample programming pulse control signal;

(k) providing the programming verification control signal;

(l) receiving from the programmable memory device, in response to the programming verification signal, a sample programming state signal which represents a programming state of the one of the plurality of programmable sample memory cells;

(m) comparing the programming state of the one of the plurality of programmable sample memory cells to a sample reference state;

(n) repeating steps (h), (i), (j), (k) and (l) if the programming state of the one of the plurality of programmable sample memory cells does not transcend the sample reference state, otherwise proceeding to step (o);

(o) determining a combination of the sample programming pulse durations of the sample programming pulses applied by the programming signal source in step (c) in accordance with steps (h), (i), (j), (k), (l), (m) and (n);

(p) repeating steps (h), (i), (j), (k), (l), (m), (n) and (o) for each remaining one of the plurality of programmable sample memory cells, then proceeding to step (q);

(q) establishing the initial main array programming pulse duration to be approximately equal to a selected one of the combinations of the sample programming pulse durations as determined in accordance with steps (h), (i), (j), (k), (l), (m), (n), (o) and (p);

(r) establishing the auxiliary main array programming pulse duration to be shorter than the initial main array programming pulse duration;

(s) providing the plurality of main array programming control signals;

(t) providing the initial main array programming pulse control signal;

(u) providing the programming verification control signal;

(v) receiving from the programmable memory device, in response to the programming verification signal, a main array programming state signal which represents a programming state of the one of the plurality of programmable main array memory cells;

(w) comparing the programming state of the one of the plurality of programmable main array memory cells to a main array reference state;

(x) proceeding to step (ad) if the programming state of the one of the plurality of programmable main array memory cells transcends the main array reference state, otherwise proceeding to step (y);

(y) providing the auxiliary main array programming pulse control signal;

(z) providing the programming verification control signal;

(aa) receiving from the programmable memory device, in response to the programming verification signal, the main array programming state signal;

(ab) comparing the programming state of the one of the plurality of programmable main array memory cells to the main array reference state;

(ac) repeating steps (o), (z), (aa) and (ab) if the programming state of the one of the plurality of programmable main array memory cells does not transcend the main array reference state, otherwise proceeding to step (ad), and (ad) repeating, with each remaining one of the plurality of remaining programmable memory cells, steps (s), (t), (u), (v), (w) and (x) including repeating steps (y), (z), (aa), (ab) and (ac) in accordance with step (x).

In accordance with another embodiment of the present invention, a method of programming a programmable memory device having multiple individually programmable memory cells includes the steps of:

(a) applying a programming mode signal to a programmable memory device in accordance with which said programmable memory device becomes configured for programming, wherein said programmable memory device includes a plurality of programmable sample memory cells and a plurality of programmable main array memory cells;

(b) applying a plurality of sample programming signals to said programmable memory device;

(c) applying a sample programming pulse having a sample programming pulse duration to one of said plurality of programmable sample memory cells;

(d) applying a programming verification signal to said programmable memory device;

(e) receiving from said programmable memory device, in response to said programming verification signal, a sample programming state signal which represents a programming state of said one of said plurality of programmable sample memory cells;

(f) comparing said programming state of said one of said plurality of programmable sample memory cells to a sample reference state;

(g) repeating steps (a), (b), (c), (d) and (e) if said programming state of said one of said plurality of programmable sample memory cells does not transcend said sample reference state, otherwise proceeding to step (h);

(h) determining a combination of said sample programming pulse durations of said sample programming pulses applied in accordance with steps (a), (b), (c), (d), (e), (f) and (g);

(i) repeating steps (a), (b), (c), (d), (e), (f), (g) and (h) for each remaining one of said plurality of programmable sample memory cells, then proceeding to step (j);

(j) establishing said initial main array programming pulse duration to be approximately equal to a selected one of said combinations of said sample programming pulse durations as determined in accordance with steps (a), (b), (c), (d), (e), (f), (g), (h) and (i);

(k) establishing said auxiliary main array programming pulse duration to be shorter than said initial main array programming pulse duration;

(l) applying a plurality of main array programming signals to said programmable memory device;

(m) applying an initial main array programming pulse having an initial main array programming pulse duration to one of said plurality of programmable main array memory cells;

(n) applying said programming verification signal to said programmable memory device;

(o) receiving from said programmable memory device, in response to said programming verification signal, a main array programming state signal which represents a programming state of said one of said plurality of programmable main array memory cells;

(p) comparing said programming state of said one of said plurality of programmable main array memory cells to a main array reference state;

(q) proceeding to step (w) if said programming state of said one of said plurality of programmable main array memory cells transcends said main array reference state, otherwise proceeding to step (r);

(r) applying an auxiliary main array programming pulse having an auxiliary main array programming pulse duration to said one of said plurality of programmable main array memory cells;

(s) applying said programming verification signal to said programmable memory device;

(t) receiving from said programmable memory device, in response to said programming verification signal, said main array programming state signal;

(u) comparing said programming state of said one of said plurality of programmable main array memory cells to said main array reference state;

(v) repeating steps (r), (s), (t) and (u) if said programming state of said one of said plurality of programmable main array memory cells does not transcend said main array reference state, otherwise proceeding to step (w); and (w) repeating, with each remaining one of said plurality of remaining programmable memory cells, steps (l), (m), (n), (o), (p) and (q) including repeating steps (r), (s), (t), (u) and (v) in accordance with step (q).

These and other features and advantages of the present invention will be understood upon consideration of the following detailed description of the invention and the accompanying drawings.

DETAILED DESCRIPTION OF THE INVENTION

Figure 1:
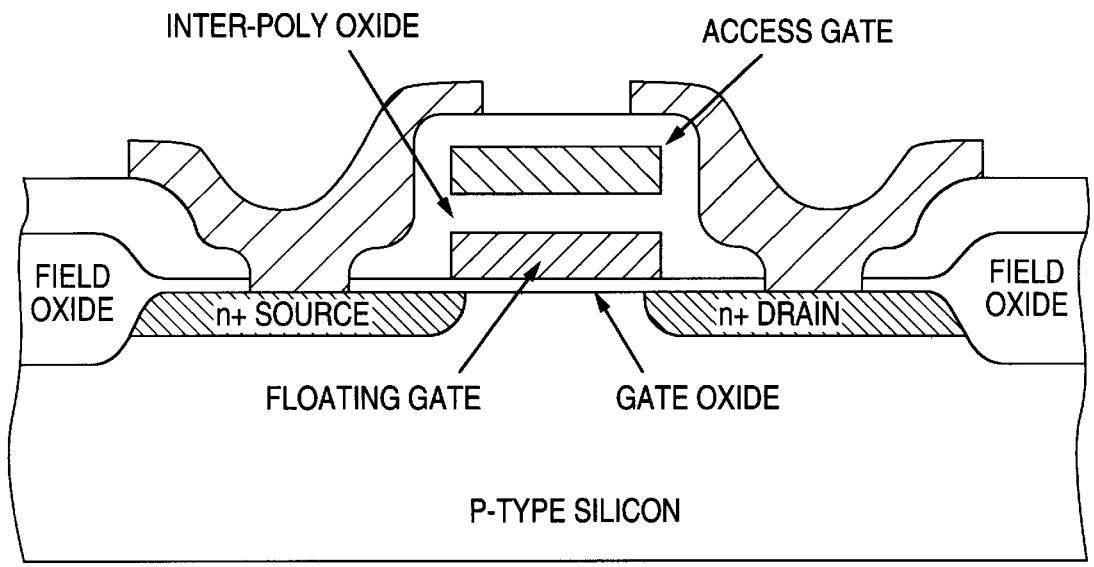
FIG. 1 is a cross-sectional view of a conventional EPROM cell.
Figure 2:
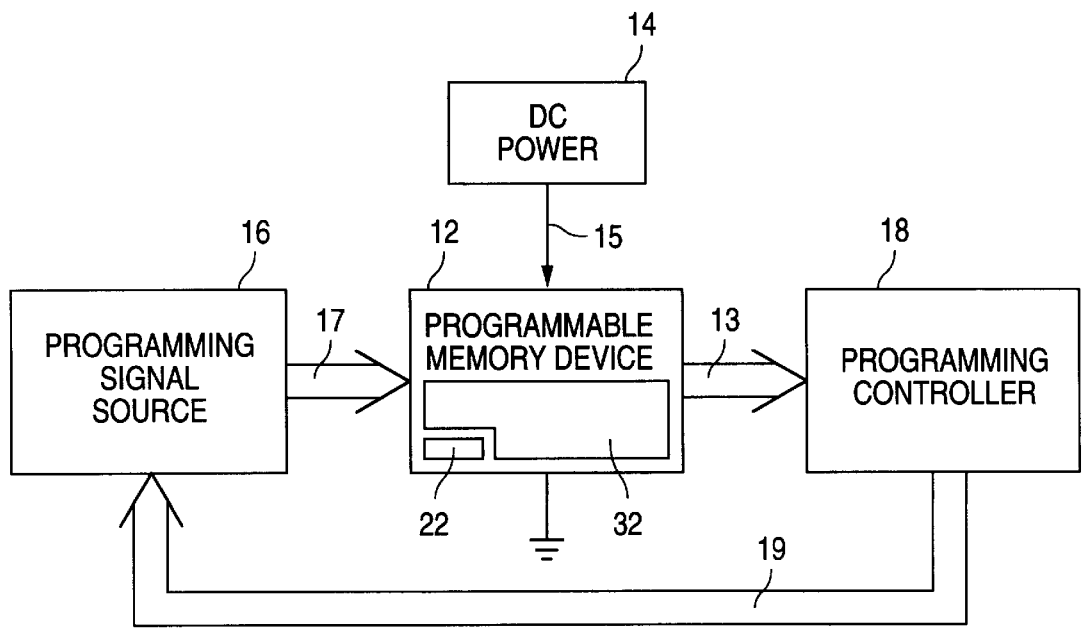
FIG. 2 is a functional block diagram of a programming system in accordance with one embodiment of the present invention.

Referring to FIG. 2, when using a programming system 10 and method in accordance with the present invention, a programmable memory device 12, such as an EPROM, is powered by dc power 15 provided by a power source 14, receives various programming signals 17 from a programming signal source 16 and provides programming state signals 13 to a programming controller 18 for verification of the state of programming of the memory device 12. The controller 18 provides programming control signals 19 for the signal source 16 in accordance with which the various programming signals 17 are generated. The control signals 19 include: a programming mode control signal; sample programming control signals; a sample programming pulse control signal; a programming verification control signal; main array programming control signals; an initial main array programming pulse control signal; and an auxiliary main array programming pulse control signal. In respective correspondence thereto, the programming signals 17 include; a programming mode signal; sample programming signals; a sample programming pulse; a programming verification signal; main array programming signals; an initial main array programming pulse; and an auxiliary main array programming pulse.

More specifically, the controller 18 provides the programming mode control signal in accordance with which the signal source 16 applies a programming mode signal to the memory device 12, thereby configuring the memory device 12 in a programming mode of operation. The controller 18 then provides the sample programming control signals in accordance with which the signal source 16 applies the sample programming signals to the memory device 12. Such sample programming control signals include sample address control signals and sample data control signals in accordance with which the signal source 16 provides corresponding sample address signals and sample data signals as parts of the sample programming signals. These address signals identify the programmable sample memory cells 22 which are to be programmed, while the sample data is the data with which such sample memory cells 22 are to be programmed. The controller 18 then provides the sample programming pulse control signal in accordance with which the signal source 16 provides the sample programming pulse, having a predetermined pulse duration, to the memory device 12. Following this, the controller 18 provides the programming verification control signal in accordance with which the signal source 16 applies the programming verification signal to the memory device 12. In response to this programming verification signal, the memory device 12 provides the sample programming state signal which represents the programming state of the sample memory cell being programmed. The controller 18 compares such programming state to a sample reference state. If such programming state does not transcend the sample reference state (e.g., exceed some predetermined minimum criterion or fall below some predetermined maximum criterion), programming of the sample memory cell is repeated with further sample programming pulses, as described above.

Once such sample cell has been programmed, a combination (e.g., sum) of the sample pulse durations required for such programming is determined. This process is then repeated for the remaining sample memory cells 22, following which one of the combinations of sample pulse durations (e.g., the maximum sum) is selected for establishing the pulse duration for the initial programming pulse for programming the main array memory cells 32. Also established is the pulse duration of the auxiliary programming pulse, with such auxiliary programming pulse duration being shorter than the initial programming pulse duration.

It should be noted that, in accordance with the present invention, other combinations of sample pulse durations can be used, as desired, for establishing the initial programming pulse duration. For example, other than the maximum sum of the sample pulse durations used for programming, the minimum sum can be used or some form of average of the sums of the various sequences of sample pulse durations used for programming the sample memory cells 22 can be used.

Following programming of the sample memory cells 22, each of the main array memory cells 32 is then programmed using the initial main array programming pulse and, as necessary, the auxiliary main array programming pulse(s). With the programming mode control signal asserted and the corresponding programming mode signal applied, the controller 18 provides the main array programming control signals which include the address and program data for the specific main array memory cell(s) 32 intended to be programmed. In accordance therewith, the signal source 16 applies the appropriate main array programming signals to the memory device 12. The controller 18 then provides the initial main array programming pulse control signal in accordance with which the signal source 16 applies the initial main array programming pulse having the predetermined pulse duration (as discussed above) to the addressed main array memory cell(s) 32. Subsequent thereto, the controller 18 provides the programming verification control signal in accordance with which the signal source 16 again applies the programming verification signal to the memory device 12. In response thereto, the memory device 12 provides a main array programming state signal which represents the programming state of the main array memory cell(s) 32 being programmed. The controller 18 compares this programming state to a main array reference state. (Preferably, although not necessarily, the main array reference state is the same as the aforementioned sample reference state.) If such programming state transcends the main array reference state, then the next one/group of the remaining memory cells 32 is/are programmed similarly. However, if such programming state does not transcend the main array reference state, then the controller 18 provides the auxiliary programming pulse control signal in accordance with which the signal source 16 applies the auxiliary main array programming pulse having a predetermined pulse duration to the memory device 12 for further programming of the previously addressed main array memory cell(s) 32. Following this, the aforementioned application of the programming verification signals and testing of the main array programming state is repeated, following which this application of auxiliary programming pulses is repeated as necessary until such time as the programming state of the addressed main array memory cell(s) 32 transcends the main array reference state. The remaining main array memory cells 32 are then similarly programmed with the initial programming signals, as well as the auxiliary programming signals as necessary.

Figure 3:
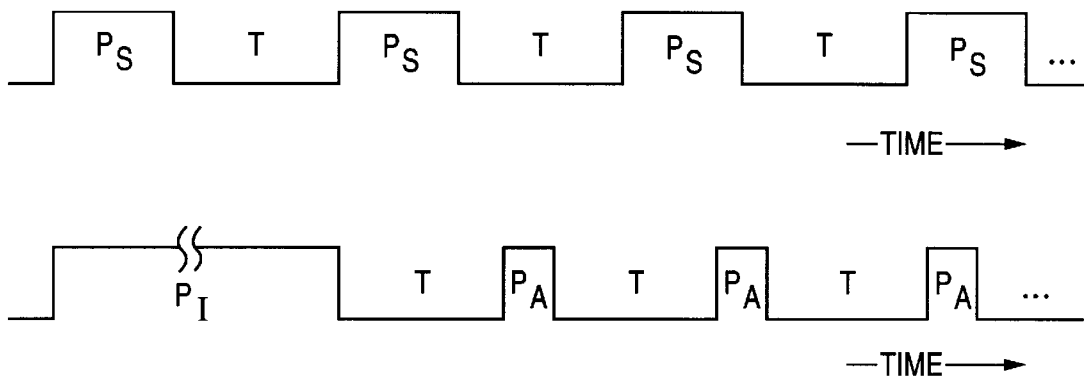
FIG. 3 is a timing diagram representing the programming pulses as applied to the sample cells and the remaining cells in accordance with the present invention.

Referring to FIG. 3, the above-described programming operation can also be illustrated as follows. The top waveform represents that portion of the programming operation when the sample memory cells 22 (FIG. 2) are programmed so as to determine the duration of the initial programming pulse for the remaining memory cells 32. Predetermined sample programming pulses $P_S$ are applied with corresponding interposed test periods T for performing verification tests upon the programming state of the sample cell. When proper programming has been verified, the sum of the sample programming pulse $P_S$ durations is used to establish the initial programming pulse $P_I$ duration for the remaining memory cells 32 (FIG. 2), as discussed above. Accordingly, for each of the remaining memory cells 32, an initial programming pulse $P_I$ is applied, followed by a verification period T. As discussed above, in the event that programming is not yet complete, auxiliary programming pulses $P_A$ (followed by corresponding verification periods T) are applied as necessary until programming is completed. (These waveforms are intended to represent the programming and testing time periods and are not intended to necessarily represent the polarities of the programming pulses; e.g., depending upon the specific type of programmable memory device, the actual pulses could have their peak amplitudes between zero and a positive voltage, zero and a negative voltage, two positive voltages, two negative voltages or a positive voltage and a negative voltage.)

Figure 4:
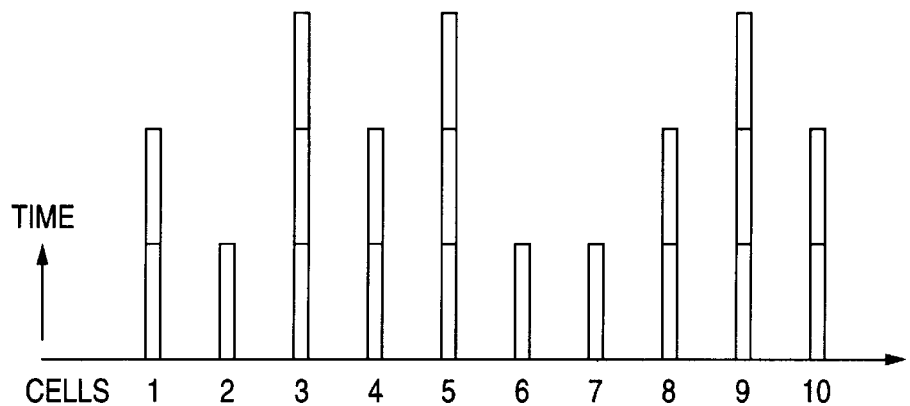
FIG. 4 represents, in bar chart form, the programming pulses applied according to conventional techniques.
Figure 5:
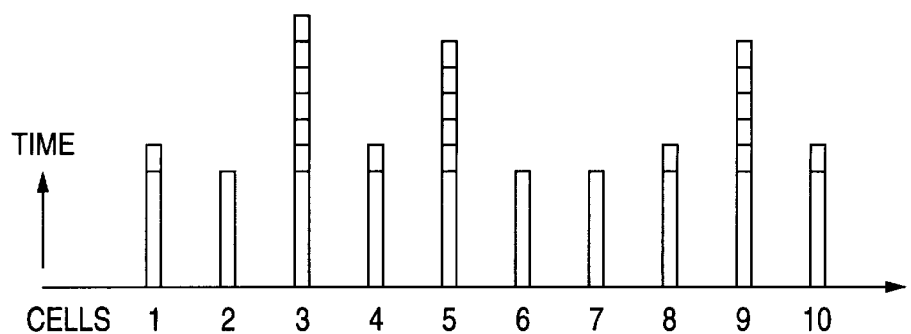
FIG. 5 represents, in bar chart form, the programming pulses applied according to the present invention.

Referring to FIGS. 4 and 5 together, the above-described differences between conventional programming techniques and a programming technique in accordance with the present invention can be represented as shown. FIG. 4 represents a conventional programming operation for the remaining memory cells 32 (FIG. 2). The height of each box represents the duration of the long programming pulse, and the number of the boxes stacked vertically indicates how often they are applied. For example, according to FIG. 4, in order to complete programming of the remaining cells 32, the first cell took two long programming pulses, the second cell took one, the third cell took three, and so on. In contrast thereto, according to FIG. 5, when programming in accordance with the present invention, in addition to the initial long programming pulse, the first cell took one auxiliary pulse, the second cell took none, the third cell took six, and so on. As is apparent from the total height of these "stacks" the average combined programming pulse width, or effective programming time, for each cell can and often will be smaller than that required by conventional programming operations.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a programming system for programming a programmable memory device, comprising:
   a programming signal source configured to couple to a programmable memory device and receive a plurality of control signals and in response thereto provide a plurality of programming signals to said programmable memory device, wherein said programmable memory device includes a plurality of programmable sample memory cells and a plurality of programmable main array memory cells; and
   a programming controller, coupled to said programming signal source, configured to couple to said programmable memory device and receive a plurality of programming state signals from said programmable memory device and in response thereto provide said plurality of control signals;
   wherein said programming signal source and said programming controller cooperate in performance of the steps of:
      programming said plurality of programmable sample memory cells with a plurality of sample programming signals by applying one or more sample programming pulses to each one thereof, wherein each one of said one or more sample programming pulses has a sample programming pulse duration;
      determining a corresponding plurality of combinations of said sample programming pulse durations of said one or more sample programming pulses applied to said plurality of programmable sample memory cells;

establishing an initial main array programming pulse duration which is approximately equal to one of said corresponding plurality of combinations of said sample programming pulse durations;

establishing an auxiliary main array programming pulse duration which is shorter than said initial main array programming pulse duration; and programming said plurality of programmable main array memory cells with a plurality of main array programming signals by applying an initial main array programming pulse and selectively applying one or more auxiliary main array programming pulses to each one thereof, wherein said initial main array programming pulse has said initial main array programming pulse duration and each one of said one or more auxiliary main array programming pulses has said auxiliary main array programming pulse duration.

2. The apparatus of claim 1, wherein, in said performance of said step of programming said plurality of programmable sample memory cells with a plurality of sample programming signals by applying one or more sample programming pulses to each one thereof, said programming signal source and said programming controller cooperate in performance of the steps of:

applying a first one of said one or more sample programming pulses to said each one of said plurality of programmable sample memory cells;

comparing a programming state of said each one of said plurality of programmable sample memory cells to a sample reference state; and applying a second one of said one or more sample programming pulses to said each one of said plurality of programmable sample memory cells if said programming state thereof does not transcend said sample reference state.

3. The apparatus of claim 1, wherein, in said performance of said step of programming said plurality of programmable main array memory cells with a plurality of main array programming signals by applying an initial main array programming pulse and selectively applying one or more auxiliary main array programming pulses to each one thereof, said programming signal source and said programming controller cooperate in performance of the steps of:

applying said initial main array programming pulse to said each one of said plurality of programmable main array memory cells;

comparing a programming state of said each one of said plurality of programmable main array memory cells to a main array reference state; and applying one or more auxiliary main array programming pulses to said each one of said plurality of programmable main array memory cells if said programming state thereof does not transcend said main array reference state.

4. The apparatus of claim 1, wherein, in said performance of said step of programming said plurality of programmable sample memory cells with a plurality of sample programming signals by applying one or more sample programming pulses to each one thereof, said programming signal source and said programming controller further cooperate in performance of the steps of:

applying a plurality of sample address signals to said programmable memory device; and applying a plurality of sample data signals to said plurality of programmable sample memory cells in correspondence with said plurality of sample address signals.

5. The apparatus of claim 1, wherein, in said performance of said step of programming said plurality of programmable main array memory cells with a plurality of main array programming signals by applying an initial main array programming pulse and selectively applying one or more auxiliary main array programming pulses to each one thereof, said programming signal source and said programming controller further cooperate in performance of the steps of:

applying a plurality of main array address signals to said programmable memory device; and applying a plurality of main array data signals to said plurality of programmable main array memory cells in correspondence with said plurality of main array address signals.

6. The apparatus of claim 1, wherein, in said performance of said step of determining a corresponding plurality of combinations of said sample programming pulse durations of said one or more sample programming pulses applied to said plurality of programmable sample memory cells, said programming signal source and said programming controller cooperate in performance of the step of determining a corresponding plurality of sums of said sample programming pulse durations of said one or more sample programming pulses applied to said plurality of programmable sample memory cells.

7. The apparatus of claim 6, wherein, in said performance of said step of establishing an initial main array programming pulse duration which is approximately equal to one of said corresponding plurality of combinations of said sample programming pulse durations, said programming signal source and said programming controller cooperate in performance of the step of establishing an initial main array programming pulse duration which is approximately equal to one of said corresponding plurality of sums of said sample programming pulse durations.

8. A method of providing an apparatus including a programming system for programming a programmable memory device, comprising the steps of:

providing a programming signal source configured to couple to a programmable memory device and receive a plurality of control signals and in response thereto provide a plurality of programming signals to said programmable memory device, wherein said programmable memory device includes a plurality of programmable sample memory cells and a plurality of programmable main array memory cells; and providing a programming controller, coupled to said programming signal source, configured to couple to said programmable memory device and receive a plurality of programming state signals from said programmable memory device and in response thereto provide said plurality of control signals;

wherein said programming signal source and said programming controller cooperate in performance of the steps of:

programming said plurality of programmable sample memory cells with a plurality of sample programming signals by applying one or more sample programming pulses to each one thereof, wherein each one of said one or more sample programming pulses has a sample programming pulse duration;

determining a corresponding plurality of combinations of said sample programming pulse durations of said one or more sample programming pulses applied to said plurality of programmable sample memory cells;

establishing an initial main array programming pulse duration which is approximately equal to one of said corresponding plurality of combinations of said sample programming pulse durations;

establishing an auxiliary main array programming pulse duration which is shorter than said initial main array programming pulse duration; and programming said plurality of programmable main array memory cells with a plurality of main array programming signals by applying an initial main array programming pulse and selectively applying one or more auxiliary main array programming pulses to each one thereof, wherein said initial main array programming pulse has said initial main array programming pulse duration and each one of said one or more auxiliary main array programming pulses has said auxiliary main array programming pulse duration.

9. The method of claim 8, wherein, in said performance of said step of programming said plurality of programmable sample memory cells with a plurality of sample programming signals by applying one or more sample programming pulses to each one thereof, said programming signal source and said programming controller cooperate in performance of the steps of:

applying a first one of said one or more sample programming pulses to said each one of said plurality of programmable sample memory cells;

comparing a programming state of said each one of said plurality of programmable sample memory cells to a sample reference state; and applying a second one of said one or more sample programming pulses to said each one of said plurality of programmable sample memory cells if said programming state thereof does not transcend said sample reference state.

10. The method of claim 8, wherein, in said performance of said step of programming said plurality of programmable main array memory cells with a plurality of main array programming signals by applying an initial main array programming pulse and selectively applying one or more auxiliary main array programming pulses to each one thereof, said programming signal source and said programming controller cooperate in performance of the steps of:

applying said initial main array programming pulse to said each one of said plurality of programmable main array memory cells;

comparing a programming state of said each one of said plurality of programmable main array memory cells to a main array reference state; and applying one or more auxiliary main array programming pulses to said each one of said plurality of programmable main array memory cells if said programming state thereof does not transcend said main array reference state.

11. The method of claim 8, wherein, in said performance of said step of programming said plurality of programmable sample memory cells with a plurality of sample programming signals by applying one or more sample programming pulses to each one thereof, said programming signal source and said programming controller further cooperate in performance of the steps of:

applying a plurality of sample address signals to said programmable memory device; and applying a plurality of sample data signals to said plurality of programmable sample memory cells in correspondence with said plurality of sample address signals.

12. The method of claim 8, wherein, in said performance of said step of programming said plurality of programmable main array memory cells with a plurality of main array programming signals by applying an initial main array programming pulse and selectively applying one or more auxiliary main array programming pulses to each one thereof, said programming signal source and said programming controller further cooperate in performance of the steps of:

applying a plurality of main array address signals to said programmable memory device; and applying a plurality of main array data signals to said plurality of programmable main array memory cells in correspondence with said plurality of main array address signals.

13. The method of claim 8, wherein, in said performance of said step of determining a corresponding plurality of combinations of said sample programming pulse durations of said one or more sample programming pulses applied to said plurality of programmable sample memory cells, said programming signal source and said programming controller cooperate in performance of the step of determining a corresponding plurality of sums of said sample programming pulse durations of said one or more sample programming pulses applied to said plurality of programmable sample memory cells.

14. The method of claim 13, wherein, in said performance of said step of establishing an initial main array programming pulse duration which is approximately equal to one of said corresponding plurality of combinations of said sample programming pulse durations, said programming signal source and said programming controller cooperate in performance of the step of establishing an initial main array programming pulse duration which is approximately equal to one of said corresponding plurality of sums of said sample programming pulse durations.

15. A method of programming a programmable memory device, comprising the steps of:

coupling to a programmable memory device which includes a plurality of programmable sample memory cells and a plurality of programmable main array memory cells;

programming said plurality of programmable sample memory cells with a plurality of sample programming signals by applying one or more sample programming pulses to each one thereof, wherein each one of said one or more sample programming pulses has a sample programming pulse duration;

determining a corresponding plurality of combinations of said sample programming pulse durations of said one or more sample programming pulses applied to said plurality of programmable sample memory cells;

establishing an initial main array programming pulse duration which is approximately equal to one of said corresponding plurality of combinations of said sample programming pulse durations;

establishing an auxiliary main array programming pulse duration which is shorter than said initial main array programming pulse duration; and programming said plurality of programmable main array memory cells with a plurality of main array programming signals by applying an initial main array programming pulse and selectively applying one or more auxiliary main array programming pulses to each one thereof, wherein said initial main array programming pulse has said initial main array programming pulse duration and each one of said one or more auxiliary main array programming pulses has said auxiliary main array programming pulse duration.

16. The method of claim 15, wherein said step of programming said plurality of programmable sample memory cells with a plurality of sample programming signals by applying one or more sample programming pulses to each one thereof comprises:

applying a first one of said one or more sample programming pulses to said each one of said plurality of programmable sample memory cells;

comparing a programming state of said each one of said plurality of programmable sample memory cells to a sample reference state; and applying a second one of said one or more sample programming pulses to said each one of said plurality of programmable sample memory cells if said programming state thereof does not transcend said sample reference state.

17. The method of claim 16, wherein:

said step of applying a first one of said one or more sample programming pulses to said each one of said plurality of programmable sample memory cells and said step of applying a second one of said one or more sample programming pulses to said each one of said plurality of programmable sample memory cells if said programming state thereof does not transcend said sample reference state together comprise applying one or more voltage pulses to a gate of a metal oxide semiconductor field effect transistor (MOSFET); and said step of comparing a programming state of said each one of said plurality of programmable sample memory cells to a sample reference state comprises determining a conductivity of said MOSFET resulting from said application of said one or more voltage pulses.

18. The method of claim 15, wherein said step of programming said plurality of programmable main array memory cells with a plurality of main array programming signals by applying an initial main array programming pulse and selectively applying one or more auxiliary main array programming pulses to each one thereof comprises:

applying said initial main array programming pulse to said each one of said plurality of programmable main array memory cells;

comparing a programming state of said each one of said plurality of programmable main array memory cells to a main array reference state; and applying one or more auxiliary main array programming pulses to said each one of said plurality of programmable main array memory cells if said programming state thereof does not transcend said main array reference state.

19. The method of claim 18, wherein:

said step of applying said initial main array programming pulse to said each one of said plurality of programmable main array memory cells and said step of applying one or more auxiliary main array programming pulses to said each one of said plurality of programmable main array memory cells if said programming state thereof does not transcend said main array reference state together comprise applying one or more voltage pulses to a gate of a metal oxide semiconductor field effect transistor (MOSFET); and said step of comparing a programming state of said each one of said plurality of programmable main array memory cells to a main array reference state comprises determining a conductivity of said MOSFET resulting from said application of said one or more voltage pulses.

20. The method of claim 15, wherein said step of programming said plurality of programmable sample memory cells with a plurality of sample programming signals further comprises:

applying a plurality of sample address signals to said programmable memory device; and applying a plurality of sample data signals to said plurality of programmable sample memory cells in correspondence with said plurality of sample address signals.

21. The method of claim 15, wherein said step of programming said plurality of programmable main array memory cells with a plurality of main array programming signals further comprises:

applying a plurality of main array address signals to said programmable memory device; and applying a plurality of main array data signals to said plurality of programmable main array memory cells in correspondence with said plurality of main array address signals.

22. The method of claim 15, wherein said step of determining a corresponding plurality of combinations of said sample programming pulse durations of said one or more sample programming pulses applied to said plurality of programmable sample memory cells comprises determining a corresponding plurality of sums of said sample programming pulse durations of said one or more sample programming pulses applied to said plurality of programmable sample memory cells.

23. The method of claim 22, wherein said step of establishing an initial main array programming pulse duration which is approximately equal to one of said corresponding plurality of combinations of said sample programming pulse durations comprises establishing an initial main array programming pulse duration which is approximately equal to one of said corresponding plurality of sums of said sample programming pulse durations.

24. A method of programming a programmable logic device comprising:

identifying a first programming pulse in response to a plurality of sample programming pulses;

identifying a second programming pulse, wherein the second programming pulse has a different pulse duration than the first programming pulse;

generating the first programming pulse to allow a plurality of memory cells in the programmable logic device to be programmed;

identifying contents stored in the plurality of the memory cells; and generating the second programming pulse to further allow the plurality of the memory cells to be programmed in response to the contents in the plurality of the memory cells.

25. The method of claim 24, further comprising:

identifying the contents stored in the plurality of memory cells when the second programming pulse is deasserted; and asserting the second programming pulse for continuing programming the plurality of memory cells in response to the contents in the plurality of the memory cells.

26. The method of claim 24, wherein the generating a first programming pulse includes generating an initial main array programming pulse.

27. The method of claim 24, wherein the generating a second programming pulse includes generating an auxiliary main array programming pulse.

28. The method of claim 24, wherein the generating a first programming pulse in response to a plurality of sample programming pulses further includes identifying the plurality of the sample programming pulses through programming a plurality of programmable sample memory cells.

29. The method of claim 24, wherein the generating the second programming pulse includes generating a shorter pulse duration of the second programming pulse than pulse duration of the first programming pulse.

30. A method of programming a programmable memory device of the type which has a plurality of programmable sample memory cells and a plurality of programmable main array memory cells, comprising the steps of:
  applying one or more sample programming pulses to each one of the plurality of programmable sample memory cells until programmed, wherein each one of said one or more sample programming pulses has a sample programming pulse duration;
  determining a corresponding plurality of combinations of said sample programming pulse durations of said one or more sample programming pulses applied to said plurality of programmable sample memory cells;
  establishing an initial main array programming pulse duration which is approximately equal to one of said corresponding plurality of combinations of said sample programming pulse durations;
  establishing an auxiliary main array programming pulse duration which is shorter than said initial main array programming pulse duration; and
  applying an initial main array programming pulse to said plurality of programmable main array memory cells and selectively applying one or more auxiliary main array programming pulses to each one thereof, wherein said initial main array programming pulse has said initial main array programming pulse duration and each one of said one or more auxiliary main array programming pulses has said auxiliary main array programming pulse duration.

31. A method of programming a programmable memory device of the type which has a plurality of programmable sample memory cells and a plurality of programmable main array memory cells, the method comprising the steps of:
  programming each one of the plurality of programmable sample memory cells using a combination of one or more sample programming pulses each of which has a sample programming pulse duration;
  determining for each one of the plurality of programmable sample memory cells a duration of the corresponding combination of one or more sample programming pulses by which it was programmed,
  establishing an initial main array programming pulse having a duration which is approximately equal to the duration of one of said corresponding combinations of one or more sample programming pulses;
  establishing an auxiliary main array programming pulse having a duration which is shorter than the duration of said initial main array programming pulse; and
  applying said initial main array programming pulse to said plurality of programmable main array memory cells and selectively applying one or more auxiliary main array programming pulses to each one thereof.

32. A method of programming a programmable memory device of the type which has a plurality of programmable sample memory cells and a plurality of programmable main array memory cells, the method comprising the steps of:
  determining for each one of the plurality of programmable sample memory cells a combination of one or more sample programming pulses required to program it;
  establishing an initial main array programming pulse having a duration which is approximately equal to a duration of one of said combinations of one or more sample programming pulses;
  establishing an auxiliary main array programming pulse having a duration which is shorter than the duration of said initial main array programming pulse; and
  applying said initial main array programming pulse to said plurality of programmable main array memory cells and selectively applying one or more auxiliary main array programming pulses to ones of said plurality of programmable main array memory cells.

* * * * *